United States Patent
Wu et al.

(10) Patent No.: US 10,170,417 B2
(45) Date of Patent: Jan. 1, 2019

(54) SEMICONDUCTOR STRUCTURE

(71) Applicant: TAIWAN SEMICONDUCTOR MANUFACTURING CO., LTD., Hsinchu (TW)

(72) Inventors: Chung-Chiang Wu, Taichung (TW); Chia-Ching Lee, New Taipei (TW); Hsueh-Wen Tsau, Miaoli County (TW); Chun-Yuan Chou, Taipei (TW); Cheng-Yen Tsai, New Taipei (TW); Da-Yuan Lee, Hsinchu County (TW); Ming-Hsing Tsai, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/817,281

(22) Filed: Nov. 19, 2017

(65) Prior Publication Data
US 2018/0090431 A1    Mar. 29, 2018

Related U.S. Application Data

(63) Continuation of application No. 15/154,989, filed on May 14, 2016, now Pat. No. 9,824,969.

(51) Int. Cl.
| | | |
|---|---|---|
| *H01L 27/092* | (2006.01) | |
| *H01L 21/28* | (2006.01) | |
| *H01L 21/8238* | (2006.01) | |
| *H01L 21/321* | (2006.01) | |
| *H01L 23/528* | (2006.01) | |
| *H01L 21/311* | (2006.01) | |
| *H01L 21/768* | (2006.01) | |
| *H01L 23/532* | (2006.01) | |
| *H01L 29/49* | (2006.01) | |
| *H01L 23/485* | (2006.01) | |

(52) U.S. Cl.
CPC ...... *H01L 23/528* (2013.01); *H01L 21/31133* (2013.01); *H01L 21/31138* (2013.01); *H01L 21/76861* (2013.01); *H01L 21/76879* (2013.01); *H01L 23/485* (2013.01); *H01L 23/53228* (2013.01); *H01L 23/53257* (2013.01); *H01L 23/53261* (2013.01); *H01L 29/4966* (2013.01)

(58) Field of Classification Search
CPC ............ H01L 23/528; H01L 23/53228; H01L 23/53257; H01L 23/53261; H01L 21/31133; H01L 21/31138; H01L 21/76879; H01L 29/4966
USPC ..... 257/369, 410, 770, 4, E27.002, E27.062, 257/E47.005, E21.175, E21.495, E21.588, 257/E21.632; 438/633, 660, 653, 216
See application file for complete search history.

(56) References Cited

U.S. PATENT DOCUMENTS

| | | |
|---|---|---|
| 8,487,378 B2 | 7/2013 | Goto et al. |
| 8,729,634 B2 | 5/2014 | Shen et al. |
| 8,826,213 B1 | 9/2014 | Ho et al. |

(Continued)

*Primary Examiner* — Dao H Nguyen
(74) *Attorney, Agent, or Firm* — Maschoff Brennan

(57) ABSTRACT

A semiconductor structure includes a substrate, a dielectric layer, a metal layer, and a tungsten layer. The dielectric layer is on the substrate and has a recess feature therein. The metal layer is in the recess feature. The metal layer has an oxygen content less than about 0.1 atomic percent. The tungsten layer is in the recess feature and in contact with the metal layer.

20 Claims, 6 Drawing Sheets

(56) References Cited

U.S. PATENT DOCUMENTS

| | | |
|---|---|---|
| 8,887,106 B2 | 11/2014 | Ho et al. |
| 9,224,675 B1 * | 12/2015 | DeHaven .............. H01L 23/481 |
| 9,431,515 B2 * | 8/2016 | Won .................. H01L 21/28088 |
| 2010/0052071 A1 | 3/2010 | Niimi et al. |
| 2012/0228715 A1 * | 9/2012 | Niimi ................ H01L 21/82384 |
| | | 257/369 |
| 2014/0282326 A1 | 9/2014 | Chen et al. |

* cited by examiner

SEMICONDUCTOR STRUCTURE

PRIORITY CLAIM AND CROSS-REFERENCE

The present application is a continuation of U.S. application Ser. No. 15/154,989, filed May 14, 2016, which is incorporated herein by reference in its entirety.

BACKGROUND

With high-speed developments of the semiconductor industry, the integration density of semiconductor devices are constantly improved, which continuously scales down the device dimensions, enhances device performance, and declines manufacturing costs. As the integration density increases, the field effect transistor (FET) undergoes three-dimensional transformation to become the fin-like field effect transistor (FinFET), while the interconnect structure on the substrate is developed into the multi-layer metallization layers. In the formation of both the FET and the interconnect structure, metal materials such as tungsten manifests critical functions. The metal materials are not only used for gap filling of the FET to form a gate stack, but also used to form wires in the interconnect structures for electrical connections through trenches or vias in the interlayer dielectric layers.

However, with the constant scaling down of the device dimensions, the widths of a gap of a gate, a via, or a trench are also constantly decreasing, which results in more and more challenges for metal materials to fully fill in a recess feature including a gap of a gate, a via, or a trench. Thus, enhancements in filling of metal materials such as tungsten into a recess feature are required to improve the overall performance of semiconductor devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
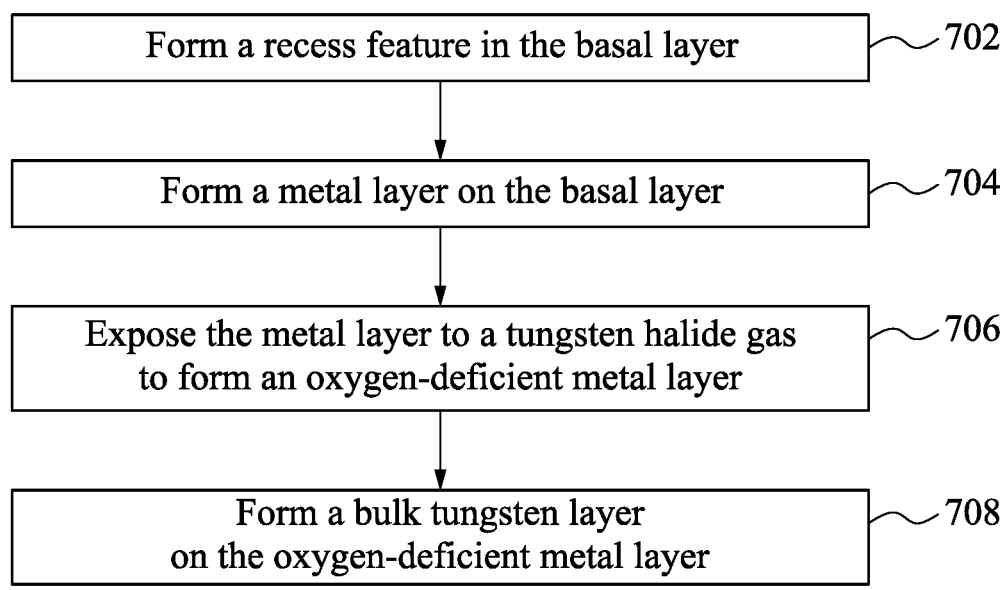
FIG. 1 is a flow chart of forming a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The singular forms "a," "an" and "the" include plural referents unless the context clearly dictates otherwise. Therefore, reference to, for example, a topography region includes aspects having two or more such topography regions, unless the context clearly indicates otherwise. Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As aforementioned, with the increase in the integration density of semiconductor devices, it is becoming more and more difficult for metal materials to fully fill in a recess feature including a gap of a gate, a via, or a trench. In terms of the categories of metal materials, tungsten (W) is a common material used to fill a recess feature of a semiconductor structure. Forming tungsten in a recess feature includes firstly forming a metal layer such as a glue layer or a seed layer in the recess feature to facilitate the adhesion of tungsten atoms, and then deposit the bulk tungsten in the recess feature by deposition methods such as the chemical vapor deposition (CVD).

Nonetheless, with the width of the recess feature continuously declining, seams or voids can be generated in the center of the recess feature during formation of the bulk tungsten, which is inevitable even for 100% conformal tungsten growth. During the subsequent chemical-mechanical polishing (CMP) or tungsten etchback process, chemical agents or etchants may leak into the seams or voids of the bulk tungsten, resulting in further enlargement of the seams or voids, which affects downstream procedures.

The main contributing factor of the seams or voids of the bulk tungsten is the decreased width of the recess feature, which hinders the reactive gases for forming the bulk tungsten from going deeper and reaching the bottom of the recess feature and renders the reactive gases mainly on the sidewalls of the recess feature. The uneven distribution of reactive gases between the sidewalls and the bottom resulting in faster tungsten deposition rates on the sidewalls while slower tungsten deposition rate at the bottom of the recess feature, which further obstructs reactive gases from reaching the bottom and brings about long seams or voids.

One of the main reasons of the decreased width of the recess feature is the increased thickness of the metal layer overlying the recess feature due to oxidation. Although the metal layer can be reduced by the reaction of the hydrogen gas with the metal oxide, the chamber with hydrogen gas flows is different from the chamber for bulk tungsten formation, which results in re-oxidation of the metal layer upon contacts with air during the transport of the semiconductor structure among chambers. Moreover, due to higher activation energy of the hydrogen gas, high-temperature plasma is required to trigger the reaction, elevating the manufacturing cost.

Therefore, the present disclosure provides a semiconductor structure and a method of forming the same, in which tungsten halide gases are utilized to remove the metal oxide, thereby increasing the width of the recess feature and enhancing the performance of the semiconductor devices.

Referring to FIG. 1, which is a flow chart of forming a semiconductor structure in accordance with some embodiments of the present disclosure. Step 702 includes forming a recess feature in the basal layer. Then, step 704 includes forming a metal layer on the basal layer, in which the metal layer is formed conformally on the basal layer and in the recess feature. Since the metal layer is apt to be oxidized upon contact with air, the subsequent step 706 includes exposing the metal layer to a tungsten halide gas to form an oxygen-deficient metal layer. The tungsten halide gas removes oxidized metal in the metal layer, thus decreasing the oxygen content of the metal layer and give rise to the oxygen-deficient metal layer. Then, step 708 includes forming a bulk tungsten layer on the oxygen-deficient metal layer.

Figure 2:
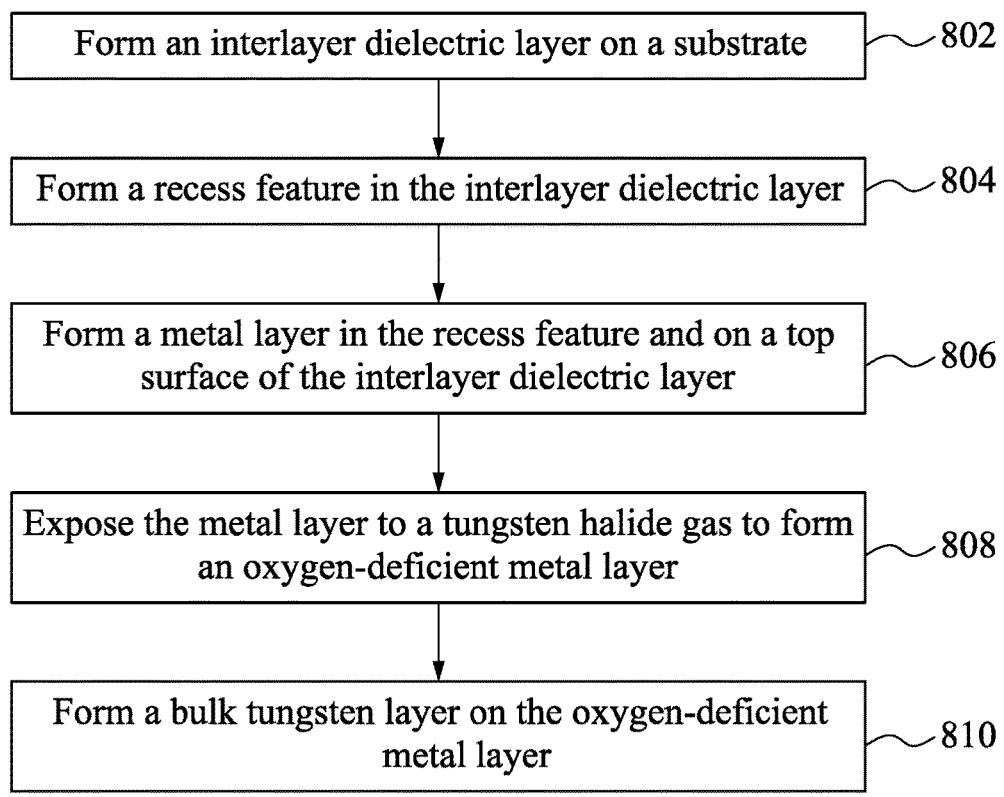
FIG. 2 is a flow chart of forming a semiconductor structure in accordance with some embodiments of the present disclosure.

Referring to FIG. 2, which is a flow chart of forming a semiconductor structure in accordance with some embodiments of the present disclosure. Step 802 includes forming an interlayer dielectric layer on a substrate. Then, step 804 includes forming a recess feature in the interlayer dielectric layer. Next, step 806 includes forming a metal layer in the recess feature and on a top surface of the interlayer dielectric layer. Subsequently, Step 808 includes exposing the metal layer to a tungsten halide gas to form an oxygen-deficient metal layer. The tungsten halide gas removes oxidized metal in the metal layer, thus decreasing the oxygen content of the metal layer and give rise to the oxygen-deficient metal layer. Then, step 810 includes forming a bulk tungsten layer on the oxygen-deficient metal layer.

Figure 3A:
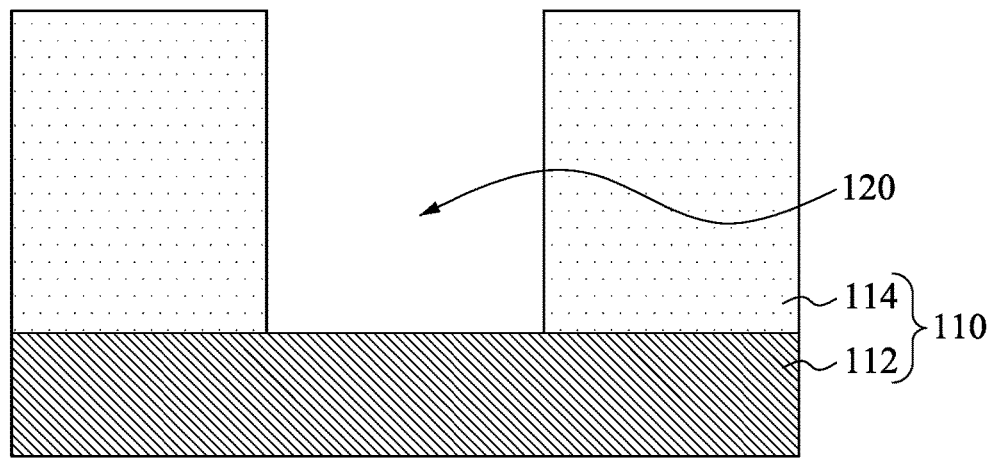
FIG. 3A to 3D are cross-sectional views of various intermediate stages of forming a semiconductor structure in accordance with some embodiments of the present disclosure.

Referring to FIG. 3A, which is a cross-sectional view of forming a recess feature in a basal layer in accordance with some embodiments of the present invention. FIG. 3A corresponds to step 702 of FIG. 1 and steps 802 and 804 of FIG. 2. In some embodiments, the basal layer 110 includes an upper portion and a lower portion. In some embodiments, the lower portion is a substrate 112, and the lower portion is an interlayer dielectric (ILD) layer 114 on the substrate 112. In some embodiments, the substrate 112 and the ILD layer 114 is a portion of a gate structure. In some embodiments, the substrate 112 and the ILD layer 114 is a portion of an interconnect structure.

In some embodiments, the substrate 112 can be formed of silicon, germanium, gallium, arsenic, other group III, group IV, and/or group V elements, and combinations thereof. The substrate 112 may also be in the form of silicon-on-insulator (SOI), which typically includes a layer of a semiconductor material, such as silicon, germanium and/or the like, formed on an insulator layer. The insulator layer may be a buried oxide (BOX) layer or a silicon oxide layer. In some embodiments, substrate 112 may include multi-layered substrates, gradient substrates, hybrid orientation substrates, combinations thereof and/or the like.

In some embodiments, the interlayer dielectric (ILD) layer 114 is formed of one or more layers of low-k dielectric material, which have a k-value (dielectric constant) lower than about 4.0. Some low-k dielectric materials have a k-value lower than about 3.5 and may have a k-value lower than about 2.5. The materials for the ILD layer 114 include silicon oxide, SiCOH, SiOC, one or more layers of a carbon-containing material, organic materials such as polymers and/or organic silicate glass, or combinations thereof. In some embodiments, the ILD layer 114 contains nitrogen. In some embodiments, the ILD layer 114 is a porogen-containing material. The ILD layer 114 may be formed by utilizing plasma-enhanced chemical vapor deposition (PECVD), low pressure CVD (LPCVD), atomic layer CVD (ALCVD), physical vapor deposition (PVD), and/or a spin-on technology.

In some embodiments, forming a recess feature 120 in the basal layer 110 includes forming the recess feature 120 in the ILD layer 114, and a bottom of the recess feature 120 exposes a portion of the substrate 112. In some embodiments, forming a recess feature 120 in the basal layer 110 includes forming the recess feature 120 in the ILD layer 114 and the substrate 112 (unillustrated).

In some embodiments, the recess feature 120 is formed by the photolithography techniques. In some embodiments, the photolithography techniques include forming a photoresist material (unillustrated) on the ILD layer 114. Then, a patterning process is applied to the photoresist layer, which includes masking, exposing, and developing the photoresist layer. After the photoresist material is patterned, dry etching or wet etching process can be performed to remove exposed portions the ILD layer 114 that are not covered by the mask (when using the positive photoresist), or the unexposed portions the ILD layer 114 that are covered by the mask (when using the negative photoresist). In some embodiments, a wet cleaning process may be combined with an ashing process to remove the photoresist. In some embodiments, where the ILD layer 114 contains silicon oxide, the ILD layer 114 may be etched by a wet etch process with a buffered oxide etch (BOE) solution, or by a dry plasma etch with etchant gases such as $CF_4$, $SF_6$, $NF_3$, and the like. A typical BOE solution includes 40% $NH_4F$ and 49% HF in water.

Figure 3B:
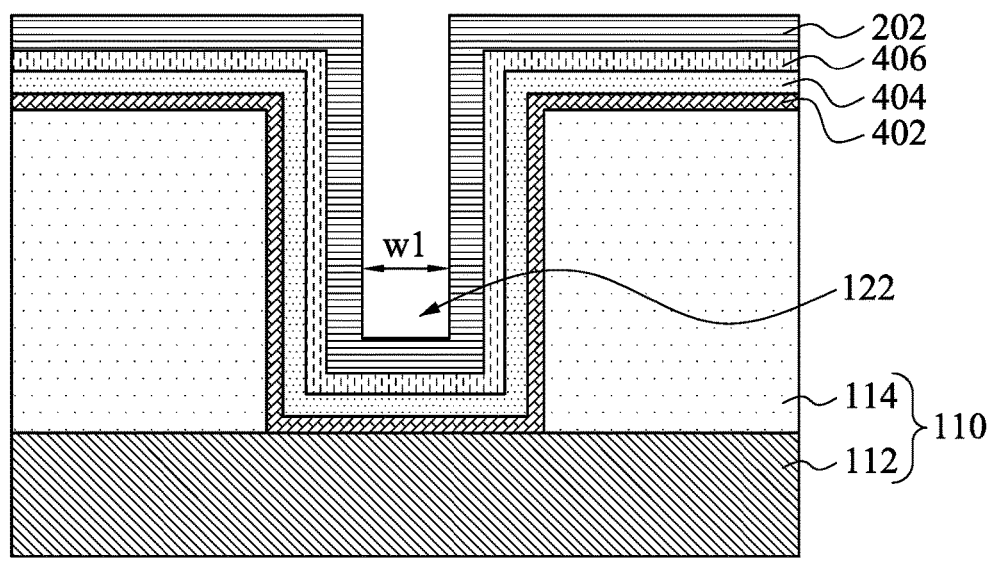

Referring next to FIG. 3B, which is a cross-sectional view of forming a metal layer 202 on the basal layer 110 in accordance with some embodiments of the present disclosure. FIG. 3B corresponds to step 704 of FIG. 1 and step 806 of FIG. 2. In some embodiments where the basal layer 110 includes the substrate 112 and the ILD layer 114, forming a metal layer 202 on the basal layer 110 is referred to as forming a metal layer 202 on the ILD layer 114 and in the recess feature 120. In some embodiments, the metal layer 202 is a seed layer. In some embodiments, the metal layer 202 is a glue layer. Forming a seed layer or a glue layer on the basal layer 110 can facilitate the deposition of bulk tungsten 300. In some embodiments where the metal layer 202 is a seed layer, the seed layer is titanium (Ti), tantalum (Ta), titanium nitride (TiN), tantalum nitride (TaN), tungsten nitride (WN), titanium carbo-nitride (TiCN), tantalum carbo-nitride (TaCN), tungsten carbo-nitride (WCN), other appropriate metals, metal nitrides or combinations thereof. In some embodiments where the metal layer is a glue layer, the glue layer is copper (Cu) or tungsten (W). In some embodiments, the metal layer can be formed by deposition methods such as the plasma-enhanced chemical vapor deposition (PECVD), low pressure CVD (LPCVD), atomic layer CVD (ALCVD), physical vapor deposition (PVD), and/or a spin-on technology.

In some embodiments, one or more layers can be formed between the metal layer 202 and the basal layer 110. In some embodiments where the substrate 112 and the ILD layer 114 are a portion of a gate structure, one or more gate-related layers can be formed between the metal layer 202 and the ILD layer 114 and between the metal layer 202 and the recess feature 120. The gate-related layers may include a high-k dielectric layer 402, a capping layer 404, and a work function metal (WFM) layer 406.

In some embodiments, a high-k dielectric layer 402 is formed in the recess feature 120 and on the ILD layer 114 to reduce current leakage before forming the metal layer 202 in the recess feature 120 and on the ILD layer 114. The high-k dielectric layer 402 can be formed of a high-k dielectric material having a k-value (dielectric constant) higher than about 4.0, such as one or more layers of Hf, Al and Zr, the oxides thereof (such as $HfO_2$, $ZrO_2$ and $Al_2O_3$), the silicates thereof (such as $HfSiO_4$, $ZrSiO_4$, and $Al_4(SiO_4)_3$) and combinations thereof. Other appropriate materials include La, Mg, Ba, Ti and Pb, the oxides thereof, and the alloy oxides thereof. In some embodiments, the high-k dielectric layer 402 can be formed conformally on the ILD layer 114 and in the recess feature 120 by suitable deposition methods such as the plasma-enhanced chemical vapor deposition (PECVD), low pressure CVD (LPCVD), atomic layer CVD (ALCVD), physical vapor deposition (PVD), and/or a spin-on technology.

In some embodiments, a capping layer 404 is formed on the high-k dielectric layer 402 before forming the metal layer 202 in the recess feature 120 and on the ILD layer 114. In some embodiments, the capping layer 404 can be formed of metal nitrides such as titanium nitride (TiN), metal oxides such as $MgTaO_x$, $SrTiO_x$, $BaTiO_x$, $CaTiO_x$, $LaAlO_x$, MgO, $TaO_x$, $MnO_x$, $VO_x$ or combinations thereof, where $0<x\leq10$. In some embodiments, the capping layer 404 can be formed by suitable deposition methods such as the plasma-enhanced chemical vapor deposition (PECVD), low pressure CVD (LPCVD), atomic layer CVD (ALCVD), physical vapor deposition (PVD), and/or a spin-on technology.

In some embodiments, a work function metal (WFM) layer 406 is formed on the capping layer 404 before forming the metal layer 202 in the recess feature 120 and on the ILD layer 114 to modulate threshold voltages of the gate structure. In some embodiments, the WFM layer 406 can be formed of one or more layers, including a titanium nitride (TiN) layer, titanium silicon nitride (TiSiN) layer, or a combination thereof. TiN exhibits highlighted thermal stability, while TiSiN exhibits high k value (dielectric constant). Thus, in some embodiments, the WFM layer 406 includes both the TiN layer and the TiSiN layer to fine-tune threshold voltages. In some embodiments, the WFM stack includes tantalum nitride (TaN), titanium aluminum nitride (TiAlN), tantalum aluminum (TaAl) or a combination thereof. In some embodiments, the WFM layer 406 can be formed by suitable deposition methods such as the plasma-enhanced chemical vapor deposition (PECVD), low pressure CVD (LPCVD), atomic layer CVD (ALCVD), physical vapor deposition (PVD), and/or a spin-on technology.

In some embodiments, the metal layer 202 formed on the WFM layer 406 may be oxidized upon contact with air. In some embodiments where the metal layer 202 is the glue layer, the metal layer 202 may be oxidized and contain $TaO_2$, $TiO_2$, TiON, WON or combinations thereof. In some embodiments where the metal layer 202 is the seed layer, the metal layer 202 may be oxidized and contain $WO_3$ or CuO. Due to the oxidation, the thickness of the metal layer 202 can be increased. In some embodiments, the metal layer 202 in the recess feature 120 includes a first recess 122, which is of a similar shape as the recess feature 120 but smaller in dimensions. The first recess 122 has a first width w1, and the first width w1 is about 5 nm to 20 nm.

Figure 3C:
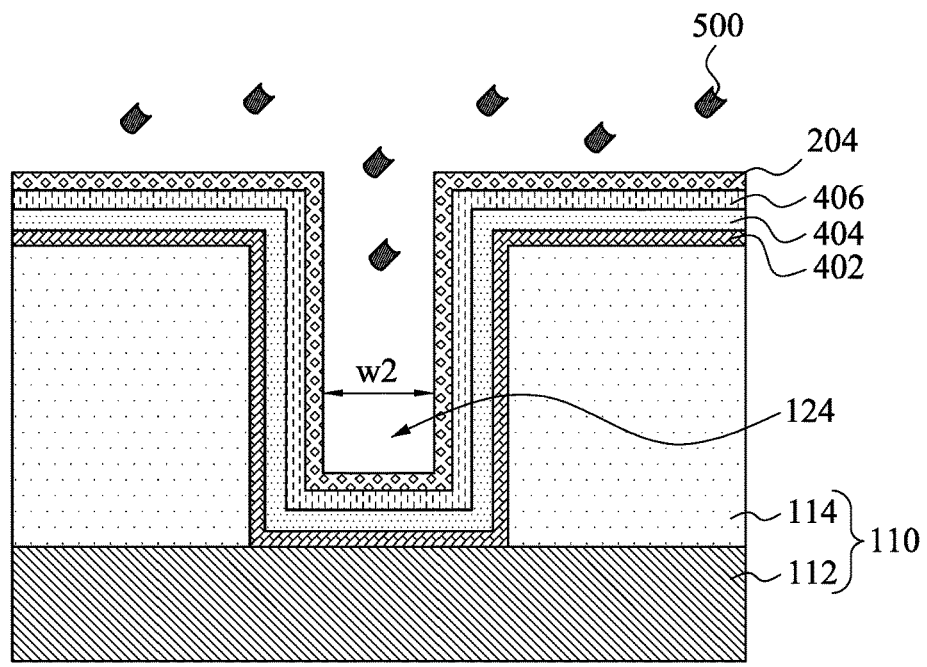

Referring next to FIG. 3C, which is a cross-sectional view of forming an oxygen-deficient metal layer in accordance with some embodiments of the present disclosure. FIG. 3C corresponds to step 706 of FIG. 1 and step 808 of FIG. 2. Compared to the previously mentioned way of using hydrogen gas to remove metal oxides, which renders the metal layer 202 apt to be re-oxidized and costs more energy, the metal layer 202 in the present disclosure is exposed to a tungsten halide gas 500 to reduce the oxidized metal to form an oxygen-deficient metal layer 204. In some embodiments, the tungsten halide gas 500 is tungsten hexafluoride ($WF_6$), tungsten pentachloride ($WCl_5$), or a combination thereof. In some embodiments, tungsten hexafluoride ($WF_6$) reacts with oxidized metal to yield the reduced metal and the tungsten oxytetrafluoride ($WOF_4$) gas (unillustrated). In some embodiments, tungsten pentachloride ($WCl_5$) reacts with oxidized metal to yield the reduced metal and the tungsten oxytetrachloride ($WOCl_4$) gas (unillustrated). Since the byproducts of reduction reaction between the tungsten halide and the oxidized metal are gaseous and autonomously dissipate, no additional cleaning or etching process is required to remove the byproducts, which lowers the complexity and costs of the procedure.

Accordingly, in some embodiments, by exposing the metal layer 202 to the tungsten halide gas 500, the metal layer 202 can be transformed into the oxygen-deficient metal layer 204. In some embodiments, exposing the metal layer 202 to the tungsten halide gas 500 proceeds for about 5 seconds to about 3 minutes. In some embodiments, the metal layer 202 may be a glue layer or a seed layer, and tungsten hexafluoride ($WF_6$) and tungsten pentachloride ($WCl_5$) exhibit distinct oxide removal rates for the glue layer and the seed layer respectively. Thus, the exposing time in the tungsten halide gas 500 differs with the kind of the tungsten halide gas 500 and the kind of the metal layer 202.

In some embodiments, where the metal layer 202 is a TiN glue layer, after the TiN glue layer is exposed in the $WF_6$ gas for about 15 seconds, the thickness of metal oxide removed is 1.8 Å. When the exposure time reaches 30 seconds, the thickness of metal oxide removed is 2 Å. When the exposure time exceeds 30 seconds, the thickness of the thickness of metal oxide removed does not significantly increase.

In some embodiments, after the TiN glue layer is exposed in the $WCl_5$ gas for about 10 seconds, the thickness of metal oxide removed is 1 Å. When the exposure time reaches 60 seconds, the thickness of metal oxide removed is 1.7 Å. This indicates that $WF_6$ gas removes $TiO_2$ or TiON at a faster rate than the $WCl_5$ gas. Although the $WF_6$ gas can rapidly remove the metal oxide in a short period, the amount of metal oxide removed by the $WF_6$ gas reaches saturation more rapidly. In contrast, the $WCl_5$ gas can progressively remove the metal oxide over a longer period.

In some embodiments, where the metal layer 202 is a W seed layer, after the W seed layer is exposed in the $WF_6$ gas for about 10 seconds, the thickness of metal oxide removed is 0.8 Å. When the exposure time reaches 25 seconds, the thickness of metal oxide removed is 2 Å. When the exposure time exceeds 25 seconds, the thickness of the thickness of removed metal oxide does not significantly increase.

In some embodiments, after the W seed layer is exposed in the $WCl_5$ gas for about 30 seconds, the thickness of metal oxide removed is 1.75 Å. With the increase of the exposure time, the thickness of metal oxide removed also increases. After 120 seconds, the thickness of metal oxide removed is 2.1 Å. This indicates that $WF_6$ gas removes $WO_3$ at a faster rate than the $WCl_5$ gas. Although the $WF_6$ gas can rapidly remove the metal oxide in a short period, the $WCl_5$ gas can progressively remove the metal oxide over a longer period and facilitate more complete removal of the tungsten oxide.

In some embodiments, the oxygen content of the oxygen-deficient metal layer 204 is less than 0.1 atomic percent (at %). In some embodiments, the oxygen-deficient metal layer 204 in the recess feature 120 includes a second recess 124, and the second recess 124 has a second width w2. The formation of oxide in the metal layer 202 increases the thickness of the metal layer by 2-5 Å, and both sides of the second recess has a layer of metal layer 202. Thus, removing the metal oxide by the tungsten halide gas 500 facilitate the second width w2 to be larger than the first width w1 by 5-10 Å, or 0.5-1 nm. In some embodiments, the first width w1 is 5-20 nm, and the second width w2 is about 6-21 nm. In other words, the second width w2 is larger than the first width w1 by 5-20%.

Moreover, removal of the oxidized metal requires the tungsten halide gas 500 such as the tungsten hexafluoride ($WF_6$), and the formation of the bulk tungsten layer 300 also requires the tungsten halide gas 500 such as the tungsten hexafluoride ($WF_6$). Hence. forming the oxygen-deficient metal layer 204 and forming the bulk tungsten layer 300 can be performed in the same chamber under a low atmospheric pressure, which avoids the oxygen-deficient metal layer 204 from contacting air and the re-oxidation. In some embodiments, the formation of the oxygen-deficient metal layer 204 also decreases the gate resistance and thus increases the performance of the semiconductor device.

Figure 3D:
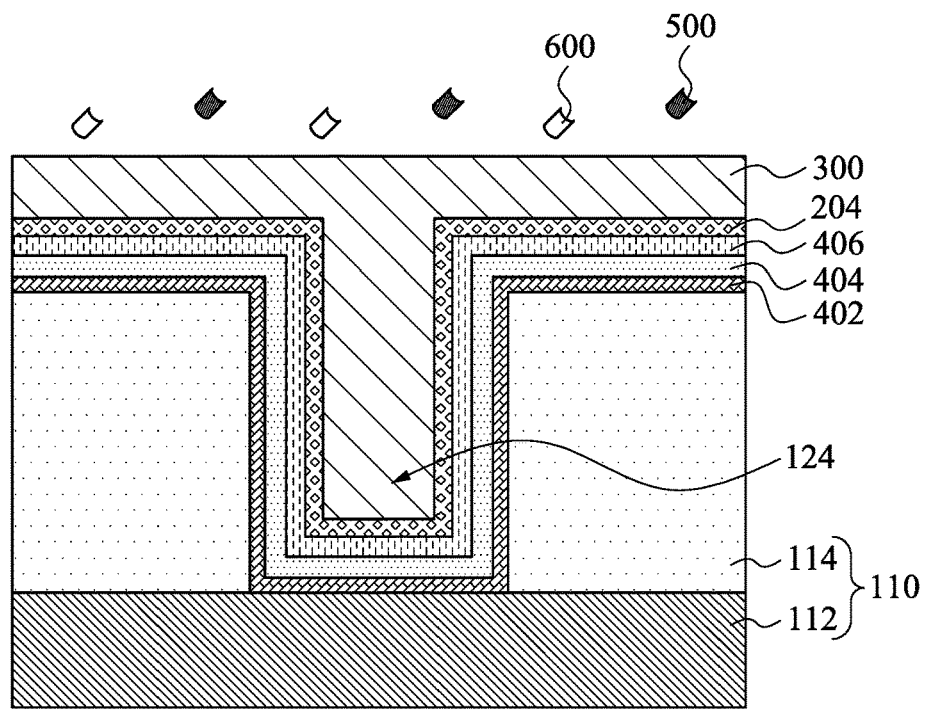

Referring next to FIG. 3D, which is a cross-sectional view of forming a bulk tungsten layer 300 on the oxygen-deficient metal layer 204 in accordance with some embodiments of the present disclosure. FIG. 3D corresponds to step 708 of FIG. 1 and step 810 of FIG. 2. In some embodiments, since the oxygen-deficient layer 204 in the recess feature 120 includes a second recess 124, the bulk tungsten layer 300 fills the second recess 124. The formation of the bulk tungsten layer can be formed by deposition methods such as the chemical vapor deposition (CVD) with the tungsten halide gas 500 and hydrogen gas 600. In some embodiments, forming the bulk tungsten layer 300 is performed by flowing tungsten hexafluoride ($WF_6$) gas 500 and hydrogen gas 600 onto the oxygen-deficient metal layer 204 to generate the bulk tungsten and hydrofluoric acid (HF, unillustrated), while the bulk tungsten deposits on the oxygen-deficient metal layer 204, the gaseous HF autonomously dissipates. In some embodiments, forming the bulk tungsten layer 300 is performed by flowing tungsten pentachloride ($WCl_5$) gas 500 and hydrogen gas 600 onto the oxygen-deficient metal layer 204 to generate the bulk tungsten and hydrochloric acid (HCl, unillustrated), while the bulk tungsten deposits on the oxygen-deficient metal layer 204, the gaseous HCl autonomously dissipates.

Since forming an oxygen-deficient metal layer 204 and forming a bulk tungsten layer 300 both require the tungsten halide gas 500, both steps can be operated in the same chamber, once hydrogen gas 600 is flowed into the chamber when forming the bulk tungsten layer 300. By combining both steps in the same chamber, the re-oxidation of the oxygen-deficient metal layer 204 can be avoided.

In some embodiments, since the oxygen-deficient metal layer 204 is thinner than the metal layer 202, the second width w2 is larger than the first width w1 by 5% to 20%. This enables the tungsten halide gas 500 to further reach the bottom of the second recess 124, which synchronizes the rates of bulk tungsten formation on the sidewalls and on the bottom surface of the second recess 124 and facilitates the in situ growth of the bulk tungsten layer 300. In some embodiments, due to even formation rates on the sidewalls and on the bottom surface of the second recess 124, the in situ grown bulk tungsten layer 300 is seamless and without voids, and can thus completely fills the second recess 124. Moreover, since the oxygen-deficient metal layer 204 is free of rough or irregularly aligned metal oxides, the bulk tungsten layer formed thereon may have a smoother and evener surface.

Figure 4A:
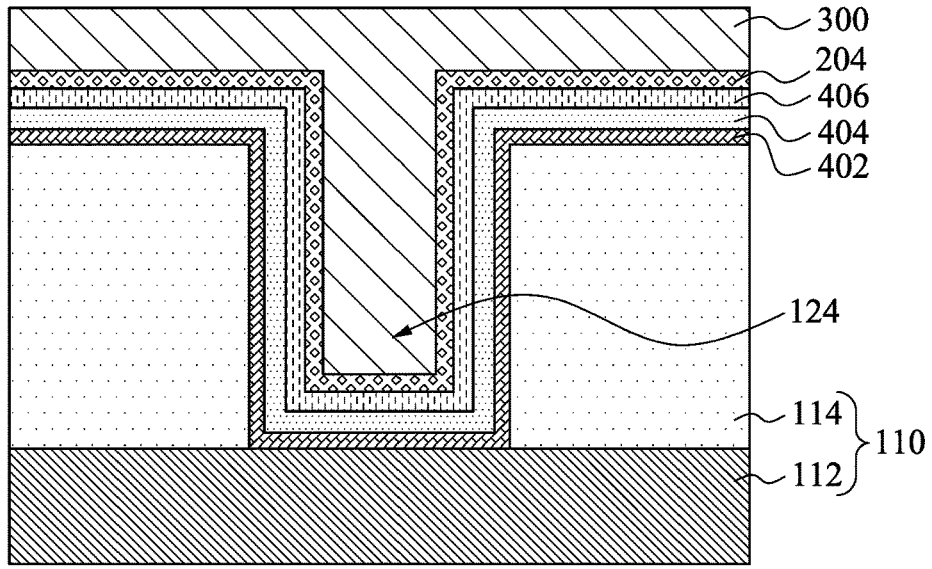
FIG. 4A is a cross-sectional view of a semiconductor structure in accordance with some embodiments of the present disclosure.

Referring to FIG. 4A, which is a cross-sectional view of a semiconductor structure 10 in accordance with some embodiments of the present disclosure. In some embodiments, the semiconductor structure 10 is a gate structure. As shown in FIG. 4A, a semiconductor structure 10 includes a basal layer 110, a high-k dielectric layer 402, a capping layer 404, a work function metal (WFM) layer 406, an oxygen-deficient metal layer 204 with a second recess 124, and a bulk tungsten layer 300. In some embodiments, the basal layer 110 includes an upper portion and a lower portion. The lower portion is a substrate 112, while the upper portion is an interlayer dielectric (ILD) layer 114 disposed on the substrate 112. In some embodiments, the ILD layer 114 includes a recess feature 120 and a top surface adjacent to the recess feature 120. In some embodiments, the recess feature 120 in the ILD layer 114 serves as a gap for gate electrode filling, and the recess feature 120 exposes a portion of the substrate 112, while the recess feature 120 is not formed in the substrate 112.

In some embodiments, the substrate 112 may be formed of silicon, germanium, gallium, arsenic, other group III, group IV, and/or group V elements, and combinations thereof. The substrate 112 may also be in the form of silicon-on-insulator (SOI), which typically includes a layer of a semiconductor material, such as silicon, germanium and/or the like, formed on an insulator layer. The insulator layer may be a buried oxide (BOX) layer or a silicon oxide layer.

In some embodiments, the ILD layer 114 includes silicon oxide, SiCOH, SiOC, one or more layers of a carbon-containing material, organic materials such as polymers and/or organic silicate glass, or combinations thereof. In some embodiments, the ILD layer 114 contains nitrogen. In some embodiments, the ILD layer 114 is a porogen-containing material.

In some embodiments, the high-k dielectric layer 402, the capping layer 404, and the work function metal (WFM) layer 406 are disposed in the recess feature 120 and on the top surface of the ILD layer 114 to decrease the leakage current and fine-tune the threshold voltage of the gate structure. Since the recess feature 120 exposes a portion of the substrate 112, the high-k dielectric layer 402 is in direct contact with the portion of the substrate 112. The capping layer 404 is disposed on the high-k dielectric layer, and the WFM layer 406 is disposed on the capping layer 404.

In some embodiments, the high-k dielectric layer 402 can be formed of a high-k dielectric material having a k-value (dielectric constant) higher than about 4.0, such as one or more layers of Hf, Al and Zr, the oxides thereof (such as $HfO_2$, $ZrO_2$ and $Al_2O_3$), the silicates thereof (such as $HfSiO_4$, $ZrSiO_4$, and $Al_4(SiO_4)_3$) and combinations thereof.

Other appropriate materials include La, Mg, Ba, Ti and Pb, the oxides thereof, and the alloy oxides thereof.

In some embodiments, the capping layer 404 can be formed of metal nitrides such as titanium nitride (TiN), metal oxides such as $MgTaO_x$, $SrTiO_x$, $BaTiO_x$, $CaTiO_x$, $LaAlO_x$, MgO, $TaO_x$, $MnO_x$, $VO_x$ or combinations thereof, where $0<x\leq10$.

In some embodiments, the WFM layer 406 can be formed of one or more layers, including a titanium nitride (TiN) layer, titanium silicon nitride (TiSiN) layer, or a combination thereof.

In some embodiments, an oxygen-deficient metal layer 204 is disposed on the WFM layer 406. In some embodiments, the oxygen-deficient metal layer 204 is an oxygen-deficient seed layer or an oxygen-deficient glue layer. Forming the oxygen-deficient seed layer or the oxygen-deficient glue layer is performed by exposing a seed layer or a glue layer to a tungsten halide gas 500. In some embodiments where the oxygen-deficient metal layer 204 is the oxygen-deficient seed layer, the oxygen-deficient seed layer is titanium (Ti), tantalum (Ta), titanium nitride (TiN), tantalum nitride (TaN), tungsten nitride (WN), titanium carbo-nitride (TiCN), tantalum carbo-nitride (TaCN), tungsten carbo-nitride (WCN), other appropriate metals, metal nitrides or combinations thereof. In some embodiments where the oxygen-deficient metal layer 204 is the oxygen-deficient glue layer, the oxygen-deficient glue layer is copper (Cu) or tungsten (W). In some embodiments, the oxygen content of the oxygen-deficient metal layer 204 is less than 0.1 atomic percent (at %).

In some embodiments, the oxygen-deficient metal layer 204 is transformed from a metal layer 202 (unillustrated) after the exposure to the tungsten halide gas. The metal layer 202 in the recess feature 120 includes a first recess 122 with a first width w1, while the oxygen-deficient metal layer 204 in the recess feature 120 includes a second recess 124 with a second width w2. Since the oxygen-deficient metal layer 204 is thinner than the metal layer 202, the second width w2 is larger than the first width w1, facilitating the bulk tungsten layer 300, which cannot completely fill the first recess 122, to seamlessly fill the second recess 124.

Figure 4B:
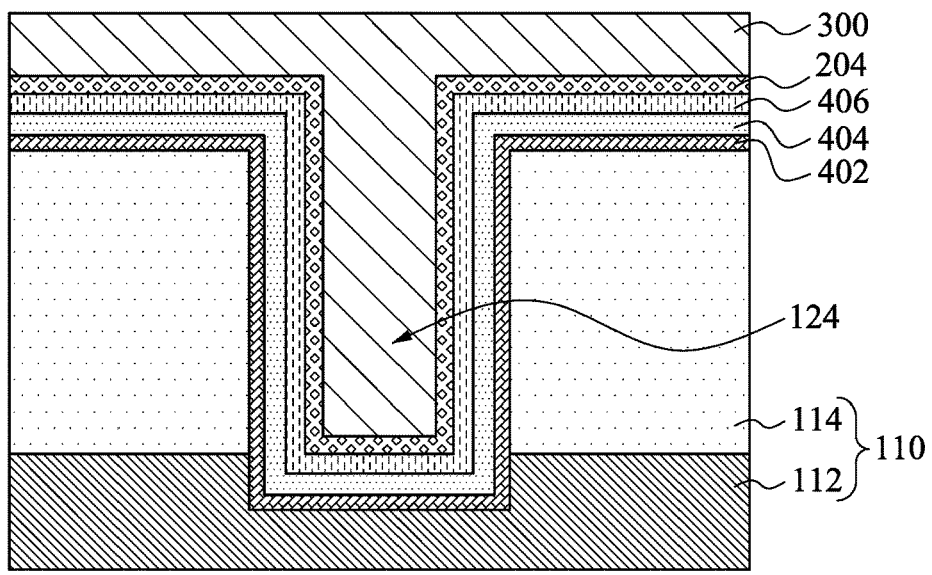
FIG. 4B is a cross-sectional view of a semiconductor structure in accordance with some embodiments of the present disclosure.

Referring to FIG. 4B, which is a cross-sectional view of a semiconductor structure 20 in accordance with some embodiments of the present disclosure. In some embodiments, the semiconductor structure 20 is a gate structure. As shown in FIG. 4B, a semiconductor structure 20 includes a basal layer 110, a high-k dielectric layer 402, a capping layer 404, a work function metal layer 406, an oxygen-deficient metal layer 204 with a second recess 124, and a bulk tungsten layer 300. In some embodiments, the basal layer 110 includes an upper portion and a lower portion. The lower portion is a substrate 112, while the upper portion is an ILD layer 114, disposed on the substrate 112. In some embodiments, the ILD layer 114 includes a recess feature 120 and a top surface adjacent to the recess feature 120. In some embodiments, the recess feature 124 in the ILD layer 114 serves as a gap for gate electrode filling, and the recess feature 120 exposes a portion of the substrate 112, and the recess feature 120 is also formed in the substrate 112.

The respective material of the substrate 112, the ILD layer 114, the high-k dielectric layer 402, the capping layer 404, the work function metal layer 406, and the oxygen-deficient metal layer 204 can be referred to the materials exemplified above.

The difference between the semiconductor structure 10 in FIG. 4A and the semiconductor structure 20 in FIG. 4B lies in the recess feature 120. In FIG. 4A, the recess feature 120 is formed only in the ILD layer 114. In FIG. 4B, the recess feature 120 is formed in both the ILD layer 114 and the substrate 112. The difference does not affect the functions of each component of the semiconductor structure 20. Therefore, the semiconductor structure 20 has the same characteristics and advantages as the semiconductor structure 10. Thus, the complete filling of bulk tungsten in the gaps of both the semiconductor structures 10 and 20 can reduce the gate resistance and enhance the performance of the overall semiconductor device.

In some embodiments, a chemical-mechanical polishing (CMP) process can be applied to the semiconductor structure 10 or 20 to remove a portion of the bulk tungsten layer 300 outside the second recess 124, which exposes a top surface of the oxygen-deficient metal layer 204 adjacent to the second recess 124. In some embodiments, the CMP process can further remove a portion of the WFM layer 406, the capping layer 404, and the high-k dielectric layer 402 outside the recess feature 120, which exposes a top surface of the ILD layer 114 adjacent to the recess feature 120.

Figure 5A:
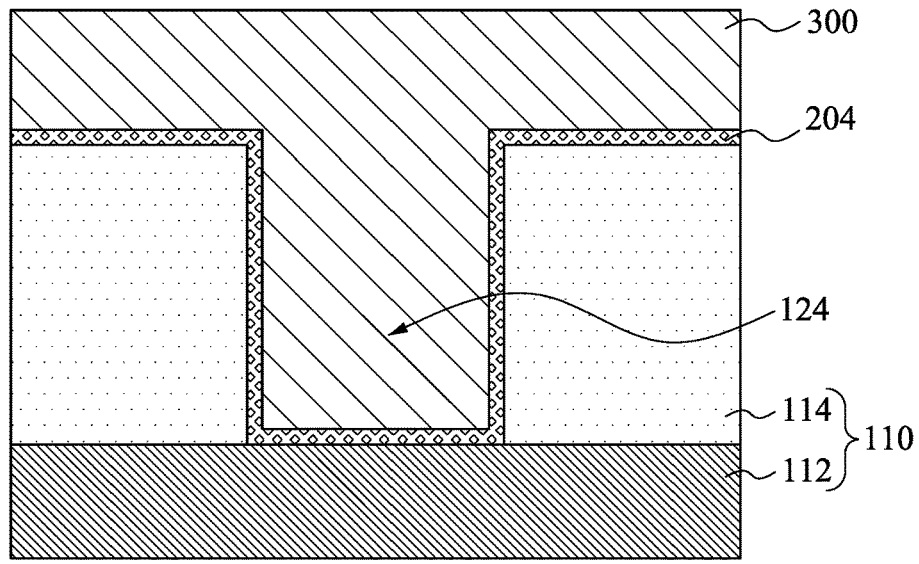
FIG. 5A is a cross-sectional view of a semiconductor structure in accordance with some embodiments of the present disclosure.

Referring to FIG. 5A, which is a cross-sectional view of a semiconductor structure 30 in accordance with some embodiments of the present disclosure. In some embodiments, the semiconductor structure 30 is an interconnect structure in a metallization layer. As shown in FIG. 5A, a semiconductor structure 30 includes a basal layer 110, an oxygen-deficient metal layer 204 with a second recess 124, and a bulk tungsten layer 300. In some embodiments, the basal layer 110 includes an upper portion and a lower portion. The lower portion is a substrate 112, while the upper portion is an interlayer dielectric (ILD) layer 114 disposed on the substrate 112. In some embodiments, the ILD layer 114 includes a recess feature 120 and a top surface adjacent to the recess feature 120. In some embodiments, the recess feature 120 is a trench or via for metal wire filling, and the recess feature 120 exposes a portion of the substrate 112, while the recess feature 120 is not formed in the substrate 112.

The substrate 112 may be a barrier layer or an etch-stop layer formed of the materials as exemplified above. The material of the oxygen-deficient metal layer 204 can also be referred to the materials exemplified above.

In some embodiments, the oxygen-deficient metal layer 204 is transformed from a metal layer 202 (unillustrated) after the exposure to the tungsten halide gas. The metal layer 202 in the recess feature 120 includes a first recess 122 with a first width w1, while the oxygen-deficient metal layer 204 in the recess feature 120 includes a second recess 124 with a second width w2. Since the oxygen-deficient metal layer 204 is thinner than the metal layer 202, the second width w2 is larger than the first width w1, facilitating the bulk tungsten layer 300, which cannot completely fill the first recess 122, to seamlessly fill the second recess 124.

Figure 5B:
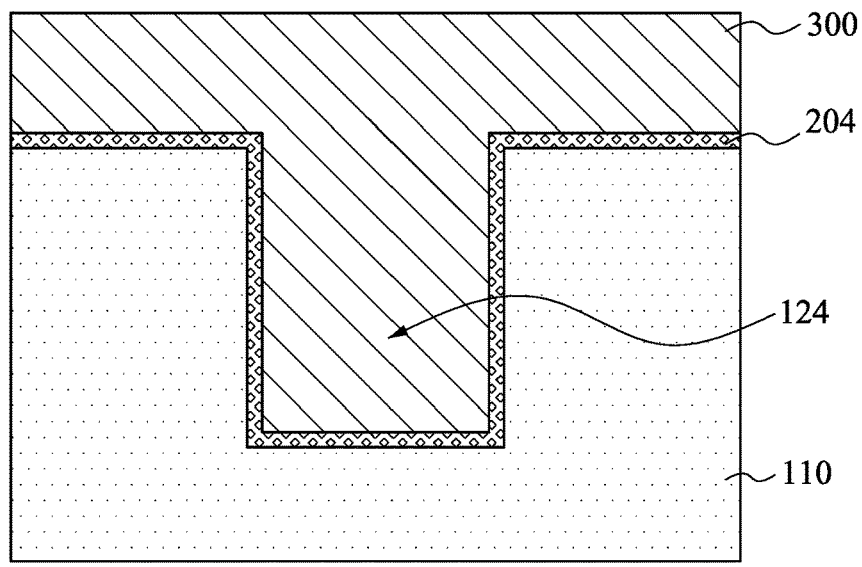
FIG. 5B is a cross-sectional view of a semiconductor device in accordance with some embodiments of the present disclosure.

Referring to FIG. 5B, which is a cross-sectional view of a semiconductor structure 30 in accordance with some embodiments of the present disclosure. In some embodiments, the semiconductor structure 30 is an interconnect structure in a metallization layer. As shown in FIG. 5A, a semiconductor structure 30 includes a basal layer 110, an oxygen-deficient metal layer 204 with a second recess 124, and a bulk tungsten layer 300. In some embodiments, the basal layer 110 is integrally formed. In some embodiments, the basal layer 110 is an interlayer dielectric (ILD) layer 114. The basal layer 110 includes a recess feature 120 and a top surface adjacent to the recess feature 120. In some embodiments, the recess feature 120 is a trench for metal wire filling, and the recess feature 120 exposes a portion of the basal layer. The material of the ILD layer 114 and the oxygen-deficient metal layer 204 can be referred to the materials exemplified above.

The difference between the semiconductor structure 30 in FIG. 5A and the semiconductor structure 40 in FIG. 5B lies in the basal layer 110. In FIG. 5A, the basal layer 110 includes both an ILD layer 114 and a substrate 112. In FIG. 5B, the basal layer 110 is integrally formed. The difference makes the two kinds of semiconductor structures suitable for different metallization layers with distinct functionalities.

In some embodiments, a chemical-mechanical polishing (CMP) process can be applied to the semiconductor structure 30 or 40 to remove a portion of the bulk tungsten layer 300 outside the second recess 124, which exposes a top surface of the oxygen-deficient metal layer 204 adjacent to the second recess 124. In some embodiments, the CMP process can further remove a portion of the oxygen-deficient metal layer 204 outside the recess feature 120, which exposes a top surface of the basal layer 110 adjacent to the recess feature 120.

In some embodiments, a second ILD layer (unillustrated) may be formed on the top surface of the oxygen-deficient metal layer 204 or the basal layer 110 after the CMP process, and a trench or a via can be formed in the second ILD layer. A second oxygen-deficient metal layer may be formed on the second ILD layer, and a second bulk tungsten layer can be formed on the second oxygen-deficient metal layer, which makes up a second metallization layer. In some embodiments, the semiconductor structure 30 or 40 may be stacked to form multiple metallization layers, and the bulk tungsten may completely fills the trenches or vias in each of the metallization layers, which facilitates effective electrical connections between metallization layers and enhances the performance of the overall semiconductor device.

In some embodiments, a semiconductor structure includes a substrate, a dielectric layer, a metal layer, and a tungsten layer. The dielectric layer is on the substrate and has a recess feature therein. The metal layer is in the recess feature. The metal layer has an oxygen content less than about 0.1 atomic percent. The tungsten layer is in the recess feature and in contact with the metal layer.

In some embodiments, the semiconductor structure further includes a work function metal layer in the recess feature and between the metal layer and the substrate.

In some embodiments, the work function metal layer has TiN, TiSiN, or combinations thereof.

In some embodiments, the work function metal layer has TaN, TiAlN, TaAl, or combinations thereof.

In some embodiments, the semiconductor structure further includes a high-k dielectric layer in the recess feature and between the metal layer and the substrate.

In some embodiments, the semiconductor structure further includes a capping layer in the recess feature and between the high-k dielectric layer and the metal layer.

In some embodiments, the capping layer has TiN, $MgTaO_x$, $SrTiO_x$, $BaTiO_x$, $CaTiO_x$, $LaAlO_x$, MgO, $TaO_x$, $MnO_x$, $VO_x$ or combinations thereof, where $0<x\leq10$.

In some embodiments, the metal layer has TiN.

In some embodiments, the metal layer has W.

In some embodiments, a semiconductor structure includes a substrate, a dielectric layer, a seed layer, and a tungsten layer. The dielectric layer is on the substrate and has a recess feature therein. The seed layer is in the recess feature. The seed layer has an oxygen content less than about 0.1 atomic percent. The tungsten layer is in the recess feature and in contact with the seed layer.

In some embodiments, the semiconductor structure further includes a work function metal layer in the recess feature and wrapping around the seed layer.

In some embodiments, the work function metal layer has TiN, TiSiN, or combinations thereof.

In some embodiments, the work function metal layer has TaN, TiAlN, TaAl, or combinations thereof.

In some embodiments, the semiconductor structure further includes a capping layer in the recess feature and wrapping around the seed layer.

In some embodiments, the capping layer has TiN, $MgTaO_x$, $SrTiO_x$, $BaTiO_x$, $CaTiO_x$, $LaAlO_x$, MgO, $TaO_x$, $MnO_x$, $VO_x$ or combinations thereof, where $0<x\leq10$.

In some embodiments, the semiconductor structure further includes a gate dielectric layer in the recess feature and wrapping around the capping layer.

In some embodiments, the gate dielectric layer has a dielectric constant higher than about 4.

In some embodiments, a semiconductor structure includes a first tungsten layer and a second tungsten layer. The first tungsten layer has an oxygen content less than about 0.1 atomic percent. The second tungsten layer is in contact with the first tungsten layer.

In some embodiments, the semiconductor structure further includes a substrate. The first tungsten layer is between the second tungsten layer and the substrate.

In some embodiments, the semiconductor structure further includes an interlayer dielectric layer. The first tungsten layer is between the second tungsten layer and the interlayer dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a substrate;
a dielectric layer on the substrate and comprising a recess feature therein;
a metal layer in the recess feature, wherein the metal layer has an oxygen content less than about 0.1 atomic percent; and
a tungsten layer in the recess feature and in contact with the metal layer.

2. The semiconductor structure of claim 1, further comprising a work function metal layer in the recess feature and between the metal layer and the substrate.

3. The semiconductor structure of claim 2, wherein the work function metal layer comprises TiN, TiSiN, or combinations thereof.

4. The semiconductor structure of claim 2, wherein the work function metal layer comprises TaN, TiAlN, TaAl, or combinations thereof.

5. The semiconductor structure of claim 1, further comprising a high-k dielectric layer in the recess feature and between the metal layer and the substrate.

6. The semiconductor structure of claim 5, further comprising a capping layer in the recess feature and between the high-k dielectric layer and the metal layer.

7. The semiconductor structure of claim 6, wherein the capping layer comprises TiN, $MgTaO_x$, $SrTiO_x$, $BaTiO_x$, $CaTiO_x$, $LaAlO_x$, MgO, $TaO_x$, $MnO_x$, $VO_x$, or combinations thereof, where $0<x\leq10$.

8. The semiconductor structure of claim 1, wherein the metal layer comprises TiN.

9. The semiconductor structure of claim 1, wherein the metal layer comprises W.

10. A semiconductor structure, comprising:
    a substrate;
    a dielectric layer on the substrate and comprising a recess feature therein;
    a seed layer in the recess feature, wherein the seed layer is in contact with the dielectric layer and has an oxygen content less than about 0.1 atomic percent; and
    a tungsten layer over and in contact with the seed layer.

11. The semiconductor structure of claim 10, further comprising a work function metal layer in the recess feature and wrapping around the seed layer.

12. The semiconductor structure of claim 11, wherein the work function metal layer comprises TiN, TiSiN, or combinations thereof.

13. The semiconductor structure of claim 11, wherein the work function metal layer comprises TaN, TiAlN, TaAl, or combinations thereof.

14. The semiconductor structure of claim 10, further comprising a capping layer in the recess feature and wrapping around the seed layer.

15. The semiconductor structure of claim 14, wherein the capping layer comprises TiN, $MgTaO_x$, $SrTiO_x$, $BaTiO_x$, $CaTiO_x$, $LaAlO_x$, MgO, $TaO_x$, $MnO_x$, $VO_x$, or combinations thereof, where $0<x\leq10$.

16. The semiconductor structure of claim 14, further comprising a gate dielectric layer in the recess feature and wrapping around the capping layer.

17. The semiconductor structure of claim 16, wherein the gate dielectric layer has a dielectric constant higher than about 4.

18. A semiconductor structure, comprising:
    a dielectric layer comprising a recess;
    a metal nitride work function layer disposed in the recess;
    a first tungsten layer over and in contact with the metal nitride work function layer, the first tungsten layer having an oxygen content less than about 0.1 atomic percent; and
    a second tungsten layer in contact with the first tungsten layer.

19. The semiconductor structure of claim 18, wherein the first tungsten layer comprises W, WN, WCN, or combinations thereof.

20. The semiconductor structure of claim 18, further comprising a capping layer underlying the metal nitride work function layer.

* * * * *